United States Patent
Fowler et al.

(10) Patent No.: US 6,191,572 B1
(45) Date of Patent: Feb. 20, 2001

(54) ADJUSTABLE FAST PRESS WITH PCA SHUTTLE AND MODULAR EXPANSION CAPABILITIES

(75) Inventors: Dwight Fowler; Chris R. Jacobsen, both of Loveland, CO (US)

(73) Assignee: Agilent Technologies Inc., Palo Alto, CA (US)

( * ) Notice: Under 35 U.S.C. 154(b), the term of this patent shall be extended for 0 days.

(21) Appl. No.: 09/087,774

(22) Filed: May 29, 1998

(51) Int. Cl.[7] .................................................. G01R 31/02
(52) U.S. Cl. ......................................... 324/158.1; 324/758
(58) Field of Search ..................................... 324/754, 755, 324/758, 158.1, 72.5, 757, 73.1; 414/800, 280

(56) References Cited

U.S. PATENT DOCUMENTS

| | | | |
|---|---|---|---|
| 4,357,575 | * 11/1982 | Uren et al. | 324/758 |
| 4,471,298 | * 9/1984 | Frohlich | 324/72.5 |
| 4,818,933 | * 4/1989 | Kerschner et al. | 324/754 |
| 4,845,843 | * 7/1989 | Babcock | 29/829 |
| 5,094,584 | * 3/1992 | Bullock | 414/800 |
| 5,614,819 | * 3/1997 | Nucci | 324/158.1 |

* cited by examiner

*Primary Examiner*—Safet Metjahic
*Assistant Examiner*—Minh Tang

(57) ABSTRACT

A mechanical press for testing printed circuit boards in conjunction with a conventional probe card testing assembly is presented. A press assembly attached to a press mount mounted over the probe card testing assembly includes a movable frame including a plate that is height-adjustable relative the movable frame and a plurality of synchronized force-applying members that are actuatable to extend the plate downward a predetermined distance with equal downward pressure across the plate. The plate is height-adjustable within the movable frame via four elongated rotatable screws that protrude through the upper surface of the press mount in order to moveably support the press assembly. Each screw has a timing belt pulley for synchronous power transmission disposed above the stationary frame upper surface. A timing belt or similar continuous belt or chain engages each belt pulley, thereby synchronizing the rotation of the screws. A shuttle system including a drawer and a pair of rails may optionally be provided to allow automatic and convenient circuit board insertion into and removal from the testing assembly.

15 Claims, 5 Drawing Sheets

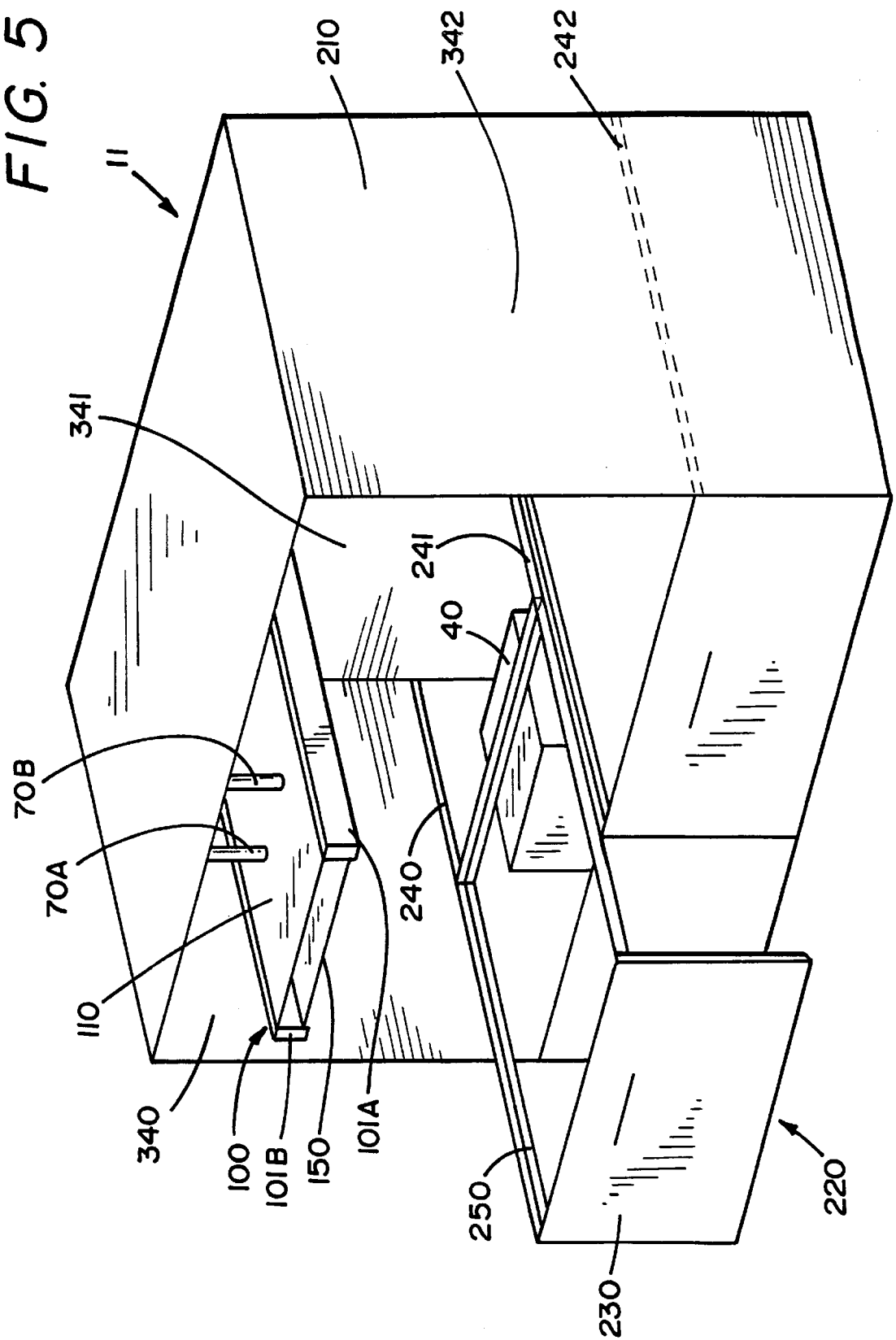

ADJUSTABLE FAST PRESS WITH PCA SHUTTLE AND MODULAR EXPANSION CAPABILITIES

FIELD OF THE INVENTION

The present invention relates generally to testing of printed circuit boards for use in electronic products and, specifically, to a press for engaging a printed circuit board to a probe card assembly.

BACKGROUND OF THE INVENTION

After printed circuit boards have been manufactured, and before they can be used or placed into assembled products, they must be tested to verify that all required electrical connections have been properly completed and that all necessary electrical components have been attached or mounted to the board in proper position and with proper orientation.

Other reasons for testing are to determine and verify whether the proper components have been used and whether they are of the proper value. It is also necessary to determine whether each component performs properly (i.e., in accordance with the specification). Some electrical components also may require adjustment after installation.

Most testers utilize a "bed-of-nails" design, which includes a probe surface having plural (thousands) of sockets that are interconnected to test equipment, such as a computer with the appropriate software. Test probes are insertable in these sockets and protrude upwardly from the probe surface. These probes are configured to match the input/output connection points of the electronic components, such as integrated circuits, resident on the printed circuit board (PCB) being tested. Further, the probes are biased upwardly such that, to ensure proper alignment, a card must be placed over the probes and sufficient downward force must be provided to the PCB such that proper electrical connection is made between the inputs/outputs of the electronic components and the test equipment, via the biased test probes.

Fixturing systems have been developed for purposes of handling printed circuit boards for testing. The most common of such fixturing systems is a vacuum fixture. There are many disadvantages associated with vacuum fixturing. In vacuum fixturing, atmospheric pressure acts directly on a PCB with a vacuum beneath it, forcing the board against spring loaded testing probes. Problems arise from the need to maintain a seal around and across the board. Maintaining a vacuum seal in an automated environment is even more troublesome. Warped printed circuit boards are commonly encountered and require a separate effort or effect to push and seat them in the fixture gasketing material. PCBs with holes or apertures generally complicate vacuum fixturing techniques because of the difficulty associated with maintaining a proper seal. Also, probe density is limited by atmospheric pressure. The seals and gasketing required also involve much periodic maintenance, and contaminants and other foreign matter may be aspirated by the fixture due to the vacuum. Furthermore, vacuum fixtures generally do not provide sufficiently forceful contact between the probes and PCBs to displace contaminants present on the board surfaces, thereby necessitating additional costs and chemical disposal issues associated with pre-cleaning the boards before testing.

In response to the aforementioned problems associated with vacuum fixturing systems, other fixturing systems have been developed, including pneumatically powered systems.

The typical pneumatic fixturing system incorporates a flat plate attached to a cylinder. Pneumatic pressure is applied to the cylinder which in turn forces the plate against the printed circuit board disposed on the probes. Testing problems arise from the fact that the center of the plate receives the majority of the force applied by the cylinder. Accordingly, the periphery of the board may not sufficiently contact and be tested by the probes. This is especially true with large and/or thin PCBs. Further, such pneumatic systems are not height adjustable relative the probes and thus are unable to accommodate boards of varying thicknesses and/or component heights.

Accordingly, what is needed in the art is a printed circuit board testing system that enables rapid and evenly distributed pressing of the boards to the test probes, allows adjustability of the press height so as to accommodate differently sized boards, and is modifiable to multiple configurations so as to enable multiple modes of operation.

SUMMARY OF THE INVENTION

According to the principles of the present invention, a mechanical press enabling quick and accurate testing of printed circuit board top and bottom sides in conjunction with a conventional probe card testing assembly is disclosed. The press provides a fixed-stroke actuator coupled with a moveable frame, thereby permitting adjustment of the press relative to the workpiece. In one embodiment, the press comprises plural actuators operating in unison to provide even distribution of force over the PCB.

In the preferred embodiment of the invention, a mechanical press is provided incorporating a stationary frame attached to the probe card testing assembly top plate. Four elongated rotatable lead screws protrude through the upper surface of the stationary frame in order to moveably support a press assembly, thereby permitting height adjustment. Each of the lead screws has a timing belt pulley or similar means for synchronous power transmission disposed above the stationary frame upper surface for driving the lead screw. A timing belt or similar continuous belt or chain engages each belt pulley, thereby synchronizing the rotation of the lead screws. The timing belt is further engaged with the teeth of a bi-directionally rotatable drive shaft proximal the stationary frame. The drive shaft and, accordingly, the lead screws are bi-directionally rotated in unison by an electrically-powered programmable motor thereby permitting the press assembly to be moved upwards or downwards. The press assembly which is suspended by the lead screws comprises a movable frame, a plate attached to the movable frame, and an actuator attached to the plate. The press assembly has four synchronized force-applying members that, when actuated, cause the plate to move rapidly downward a distance of approximately four inches. A shuttle system comprising a drawer and a pair of rails may optionally be provided to allow automatic and convenient circuit board insertion into and removal from the testing assembly. The drawer has a partially open bottom surface and is sized to accommodate a printed circuit board placed therein. The rails are attached to the stationary frame and are configured to engage the drawer and permit horizontal movement of the drawer along at least a portion of their length.

BRIEF DESCRIPTION OF THE DRAWING

The invention will be better understood from a reading of the following detailed description taken in conjunction with the drawing figures in which like reference designators are used to designate like elements, and in which:

FIG. 5 is a perspective view of a dual bay embodiment of a PCB press according to the present invention.

DETAILED DESCRIPTION

Figure 1:
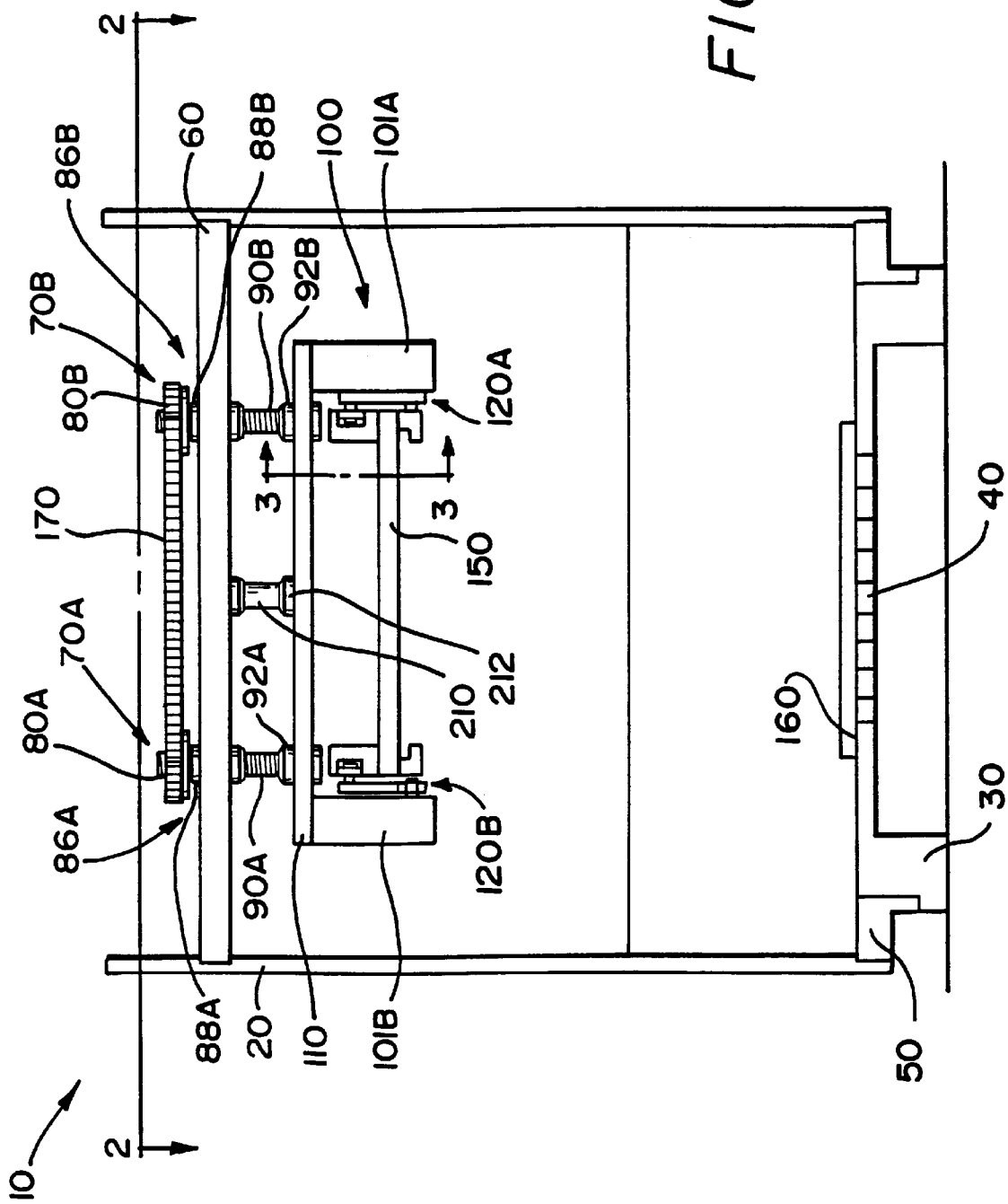
FIG. 1 is a front plan view of the PCB press according to the present invention.

The drawing figures are intended to illustrate the general manner of construction and are not to scale. In the description and in the claims the terms left, right, front and back and the like are used for descriptive purposes. However, it is understood that the embodiment of the invention described herein is capable of operation in other orientations than is shown and the terms so used are only for the purpose of describing relative positions and are interchangeable under appropriate circumstances.

As shown in FIG. 1, a PCB press 10 includes a stationary frame 20 having flanges 50, which are attached to a conventional probe card testing assembly 30. Probe card testing assembly 30 includes a conventional probe card 40 used for testing a printed circuit board 160. PCB press 10 comprises press assembly 100, which is a fast-acting press that moves press plate 150 rapidly through a fixed stroke. Press assembly 100 is height adjustable within frame 20 by means of lead screw assemblies 70A, 70B, 70C, and 70D disposed substantially proximal the peripheral corners of press assembly 100. For purposes of clarity, only the details of lead screw assembly 70A are described in detail, however, lead screw assemblies 70B–70D comprise substantially identical elements. Lead screw assembly 70A comprises an upper bearing portion 86A that rotates within but is constrained in the axial direction by bearing journal 88A disposed in press mount 60 of frame 20. Lower portion 90A of lead screw assembly 70A is threaded into a threaded boss 92A in press assembly upper plate 110 such that, when lead screw 70A is rotated, upper plate 110 (and with it press assembly 100) are drawn toward or forced away from press mount 60 of frame 20. Disposed atop lead screw assembly 70 is a driving member 80A, which preferably comprises a gear, chain sprocket, timing belt pulley or similar apparatus for receiving synchronized power transmission.

Figure 2:
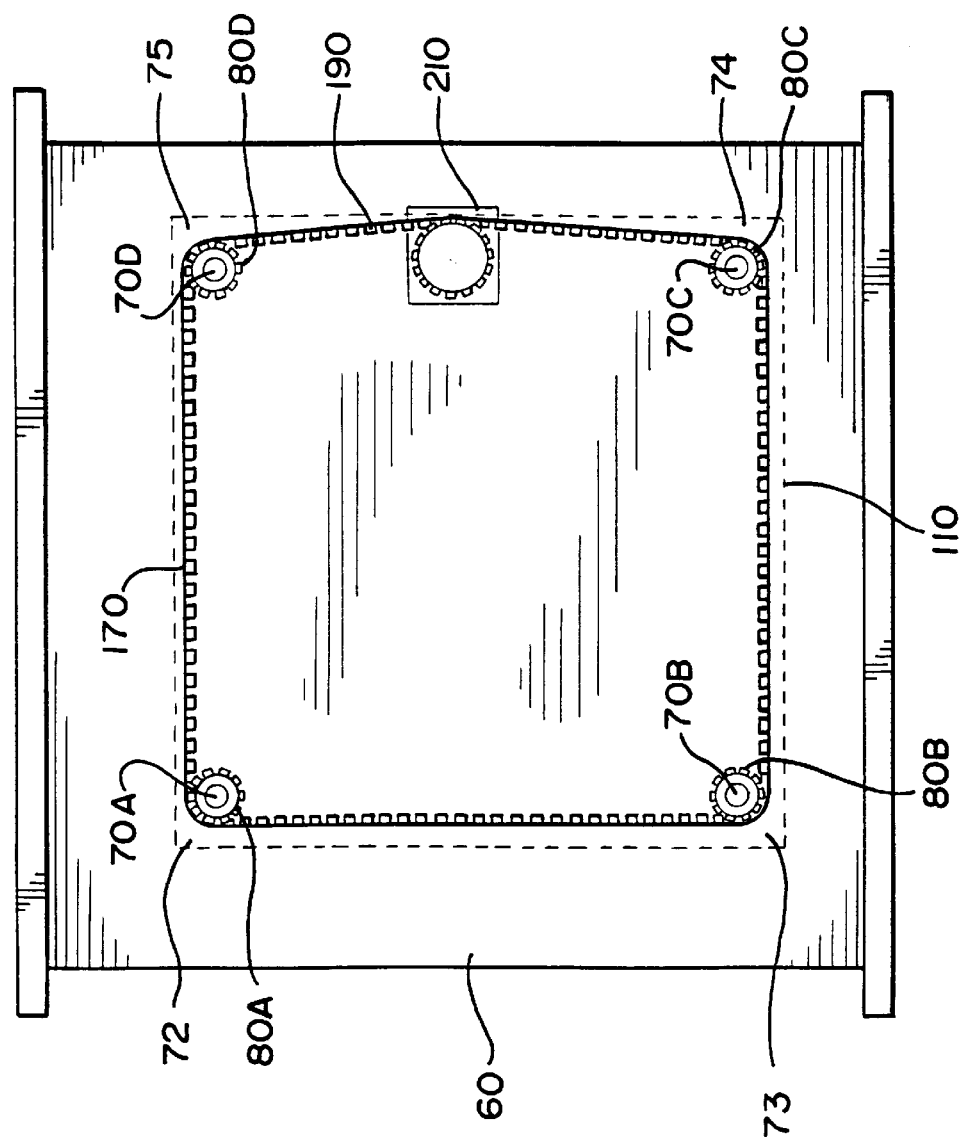
FIG. 2 is a partial top plan view of the PCB press according to the present invention.

With reference to FIGS. 1 and 2, in the illustrative embodiment, four lead screw assemblies 70A–70D are disposed proximal the peripheral corners 72, 73, 74 75 of press assembly upper plate 110 (shown in dashed lines in FIG. 2). A conventional link-and-roller chain 170 engages driving members 80A–80D in conventional fashion to cause the rotation of all of lead screw assemblies 70A–70D to be synchronized. By synchronizing the rotation of lead screw assemblies 70A–70D, each of which have the identical helical pitch, upper plate 110 can be moved toward or away from press mount 60 of frame 20 while maintaining upper plate 110 in a precisely horizontal attitude. For added stability, stabilizer rail 211 is rigidly mounted in press mount 60 so as to slidingly engage a stabilizer bushing 212 in press assembly upper plate 110. Additional stabilizer rails may be added as required for the particular application. Lead screw assemblies 70A–70D may be manually adjusted or, as shown in FIG. 2, a drive motor 190 may be coupled via sprocket 210 to chain 170 thereby providing a power-adjustment feature. Although a conventional link-and-roller chain is disclosed in the illustrative embodiment, a timing belt, gear train, flexible shafting, or any other conventional means of synchronously driving a plurality of parallel shafts is contemplated within the present invention.

Figure 3:
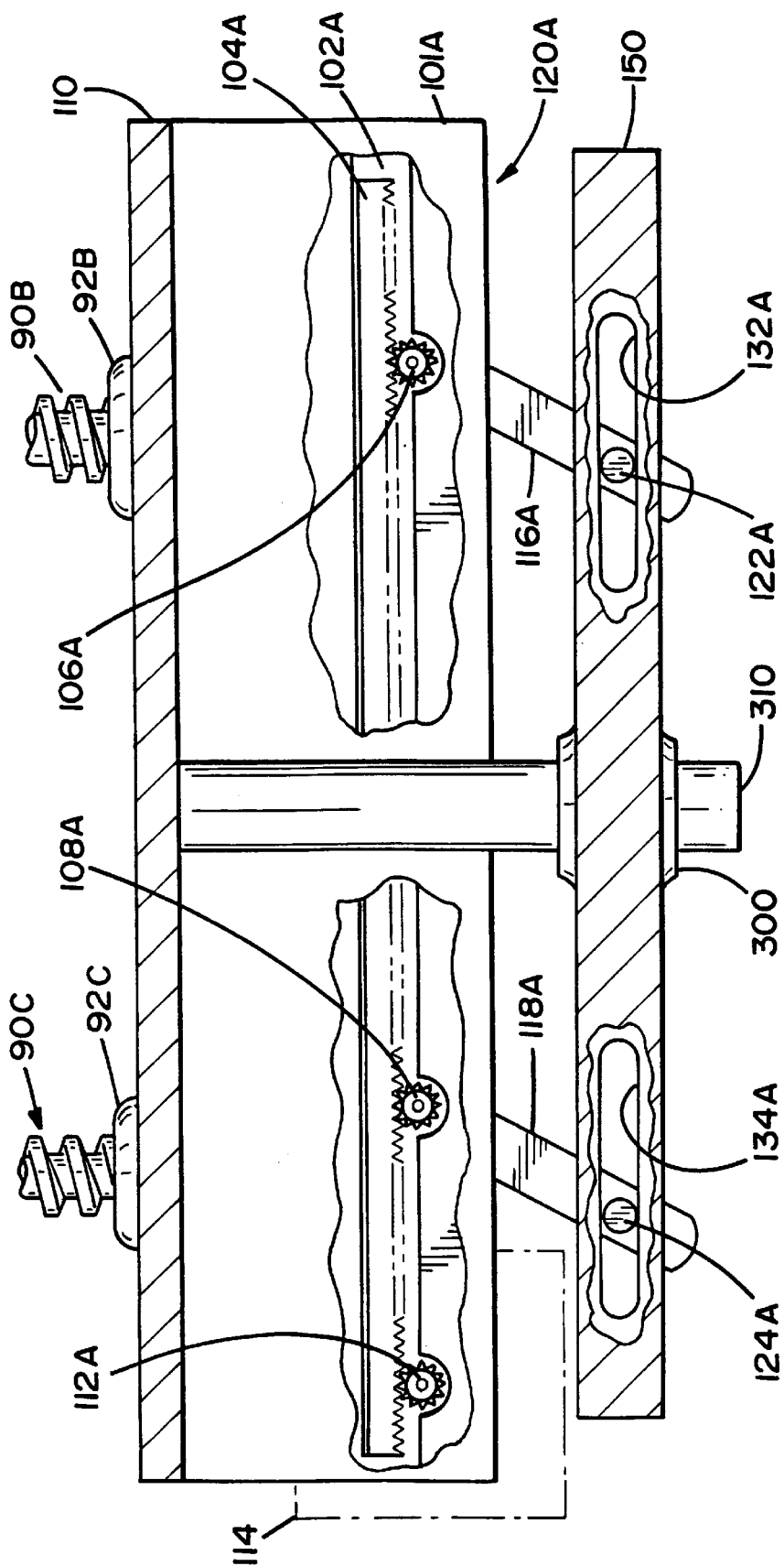
FIG. 3 is a partial cross-section of FIG. 1 along line 3—3.

FIG. 3 is a partial cross-section of FIG. 1 along line 3—3 with the press plate 150 near the fully extended position (press plate 150 is shown fully retracted in FIG. 1). With reference to FIGS. 1 and 3, press assembly 100 comprises side plates 101A and 101B, which are rigidly attached to opposite sides of press assembly upper plate 110. Each of side plates 101A and 101B support substantially equivalent actuator mechanisms 120A (FIG. 3) and 120B (not shown). Accordingly, for the sake of brevity, only the actuator mechanism supported by side plate 101A is discussed in detail herein. Side plate 101A has a channel 102A formed therein. Disposed within channel 102A is a linear gear, also known as a rack, 104A. Rack 104A engages driven pinions 106A and 108A and also engages a drive pinion 112A. Driven pinions 106A and 108A are coupled to bell crank arms 116A and 118A, respectively. Crank pins 122A and 124A, respectively, are disposed transversely in bell crank arms 116A and 118A, respectively, such that the distance from the center of pinion 106A to crank pin 122A is equal to the distance from the center of pinion 108A to crank pin 124A. Crank pin 122A engages a corresponding slot 132A in press plate 150 and crank pin 124A engages a corresponding slot 134A in press plate 150.

In operation, rotary actuator 114 rotates drive pinion 112A, which in turn causes rack 104A to translate along channel 102A. Translation of rack 104A causes pinions 106A and 108A to rotate in unison, which causes bell crank arms 116A and 118A also to rotate in unison, thereby extending press plate 150 downward. Guide rail 300 is rigidly mounted to press assembly upper plate 110 such that it engages a guide bushing 310 in press plate 150. Guide rail 300 thereby constrains press plate 150 to move vertically along guide 300 as bell crank arms 116A and 118A rotate. Because bell crank arms 116A and 118A move in unison, press plate 150 is extended downward with equal downward pressure at both ends.

It should be observed that, unlike linear actuators or ball-screw type presses, the vertical force exerted by bell crank arms 116A and 118A is a function of 1/sin of the angle between bell crank arms 116A and 118A and the horizontal. Since 1/sin approaches infinity as the angle approaches 90 degrees, the vertical force multiplication exerted by bell crank arms 116A and 118A is highest at the beginning and end of the stroke. Thus, the actuator mechanism 120A moves rapidly through most of the stroke yet is able to exert a substantial downward force on the PCB being tested with a modest torque exerted at pinions 106A and 108A. In the illustrative embodiment, the distance between the center of pinions 106A and 108A is two inches. Thus, the total stroke of press plate 150 with bell crank arms 116A and 118A moving through 180 degrees is four inches.

Figure 4:
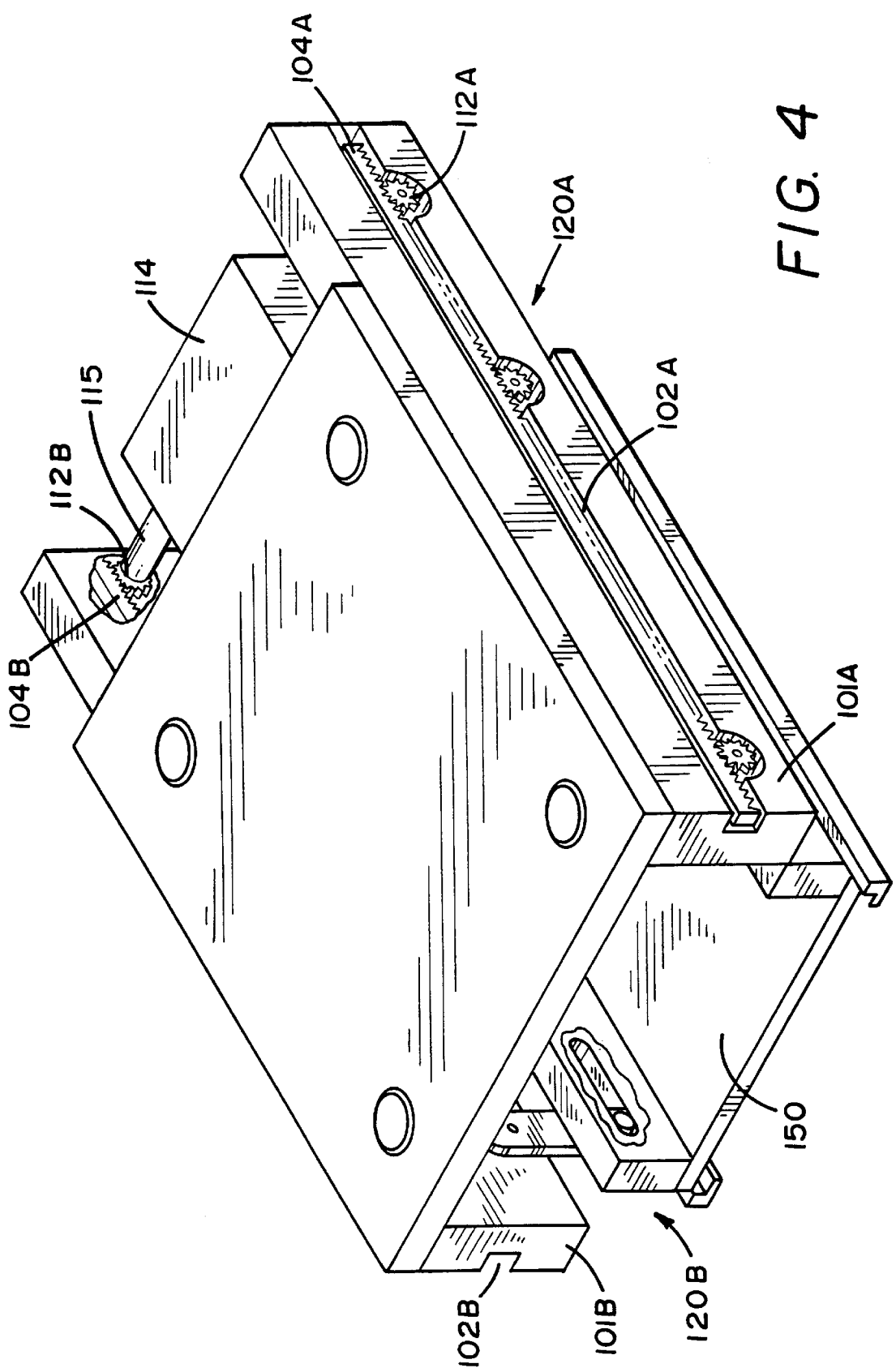
FIG. 4 is an isometric perspective view of the press assembly according to the present invention.

FIG. 4 is an isometric perspective view of press assembly 100. As noted above, side plate 101B supports an actuator mechanism 120B, which is a functionally identical, mirror image of actuator mechanism 120A discussed herein. Preferably, rotary actuator 114 comprises a conventional double-ended actuator having a common shaft 115 that drives both driven pinion 112A of actuator mechanism 120A and a corresponding driven pinion 112B of actuator mechanism 120B. In this way, rack 104A and rack 104B are translated synchronously within corresponding channels 102A and 102B. This in turn ensures that actuator mechanism 120A and 120B are synchronized and, therefore, that equal pressure is applied to all four corners of press plate

150. Rotary actuator may 114 may be electrically or vacuum operated, but is preferably a conventional pneumatic rotary actuator. Brackets 125A and 125B depend from side plates 110A and 110B and provide an installation platform for optional conventional equipment that may be used to test electronic elements disposed on the upper surface of a PCB.

As seen in FIG. 5, PCB press 11 is shown with press assembly 100 disposed within stationary frame 210 which comprises a dual-bay version of frame 20. Also shown is an optional shuttle system 220 enabling mechanical placement of circuit board 160 upon testing assembly 30. Shuttle system 220 consists of at least one drawer 230 and a drawer support that may take the form of a set of rails 240, 241 and 242. Rails 240, 241 and 242 allow drawer 230 to move in and out of frame 20 and to be placed in a position below press assembly 100 for circuit board 160 testing. Movement of drawer 230 in an out of frame 20 may be manually or automatically produced. Drawer 230 has a substantially open bottom surface 250 that simultaneously supports a circuit board 160 placed thereon and enables interfacing forced by press plate 150 between circuit board 160 and probe card 40. Shuttle system 220 protects the fragile probe card assembly by providing a bed into which the operator places the PCB remote from the probe card assembly and thus enables precise regulation of the extent to which the PCB contacts the probe card assembly.

Although the invention has been described in terms of the illustrative embodiment, it will be appreciated by those skilled in the art that various changes and modifications may be made to the illustrative embodiment without departing from the spirit or scope of the invention. It is intended that the scope of the invention not be limited in any way to the illustrative embodiment shown and described but that the invention be limited only by the claims appended hereto.

What is claimed is:

1. A press for testing printed circuit boards in conjunction with a conventional probe card testing assembly, the press comprising:
    a press mount, said press mount being mounted over the probe card testing assembly; and
    a press assembly attached to said press mount said press assembly comprising:
        a movable frame;
        a plate attached to said movable frame having a first end and a second end, said plate being height adjustable relative said movable frame; and
        a plurality of synchronized force-applying members coupled to said movable frame that are actuatable to extend said movable frame downward with equal downward pressure on both said first end and said second end of said plate.

2. A press for testing printed circuit boards in accordance with claim 1 comprising:
    a shuttle system comprising:
        a drawer, said drawer having a substantially open bottom surface, said drawer sized to accommodate a printed circuit board placed therein, and
        a drawer support disposed within said stationary frame, said drawer support configured to engage said drawer and to permit horizontal movement of said drawer along said drawer support.

3. A press for testing printed circuit boards in accordance with claim 1, comprising:
    a plurality of synchronously rotatable screws each comprising a sprocket for rotating said screws; and
    a chain engaging each of said plurality of sprockets for rotating said screws synchronously to actuate height adjustment of said plate relative the probe card assembly.

4. A press for testing printed circuit boards in accordance with claim 3 comprising:
    a sprocket coupled to said chain; and
    a motor coupled to said sprocket to drivingly rotate said chain.

5. A press for testing printed circuit boards in accordance with claim 4 wherein said motor is electrically-powered.

6. A press for testing printed circuit boards in accordance with claim 4 wherein said motor is programmable.

7. A press for testing printed circuit boards in accordance with claim 1, wherein said press assembly comprises:
    an actuator coupled with said plurality of synchronized force applying members.

8. A press for testing printed circuit boards in accordance with claim 7 wherein said force applying members comprise bell crank arms which rotate in unison upon actuation by said actuator.

9. A press for testing printed circuit boards in conjunction with a conventional probe card testing assembly, the press comprising:
    a press mount, said press mount being mounted over the probe card testing assembly;
    a plurality of synchronously rotatable screws each comprising a sprocket for rotating said screw; and
    a chain engaging each of said sprockets for rotating said screws synchronously to actuate height adjustment of said plate relative the probe card assembly;
    a press assembly attached to said press mount said press assembly comprising a movable frame having an upper surface, said upper surface having a plurality of threaded bosses for engaging said screws, an actuator attached to said movable frame, and a plate attached to said actuator by a plurality of synchronized force-applying members; and
    a shuttle system comprising a drawer and a drawer support, said drawer having a substantially open bottom surface, said drawer sized to accommodate a printed circuit board placed therein, said drawer support disposed within said stationary frame, said drawer support configured to engage said drawer and to permit horizontal movement of said drawer along said drawer support.

10. A method of testing printed circuit boards in conjunction with a conventional probe card testing assembly having a top plate, said top plate having an upper surface, the method comprising the steps of:
    causing a printed circuit board of specific thickness to be placed in a testing position on the testing assembly; and
    simultaneously actuating a plurality of synchronized force-applying members that are coupled to a movable frame having a plate with a first end and a second end attached thereto, said plate being height adjustable relative said movable frame, thereby causing the plate to move a single rapid predetermined stroke to contact the printed circuit board with sufficient force and with equal downward pressure on both said first end and said second end of said plate to enable testing of the printed circuit board.

11. A method in accordance with claim 10 comprising the step of:
    prior to performing the actuation step, moving said plate and force-applying members a predetermined adjustable height above said top plate upper surface.

12. A method in accordance with claim 10 wherein said force-applying members are pneumatically actuated.

13. A method in accordance with claim 10 wherein said force-applying members comprise bell crank arms.

14. A method in accordance with claim 10 wherein said force-applying members are actuated by a rack-and-pinion assembly.

15. A method of testing printed circuit boards in conjunction with a conventional probe card testing assembly, the method comprising the steps of:

causing a printed circuit board of specific thickness to be placed in a testing position upon the testing assembly;

moving a press assembly comprising a movable frame, said movable frame being coupled to a plurality of force-applying members and having a plate with a first end and a second end attached thereto, said plate being height adjustable relative said movable frame; and simultaneously actuating said force-applying members by means of a pneumatic rotary actuator thereby causing said plate to move a predetermined stroke to contact the printed circuit board with sufficient force and with equal downward pressure on both said first end and said second end of said plate to enable testing of the printed circuit board.

* * * * *